(12) United States Patent
Hwang et al.

(10) Patent No.: US 7,750,280 B2
(45) Date of Patent: Jul. 6, 2010

(54) BACK-ILLUMINATED IMAGE SENSOR AND METHOD OF FABRICATING THE SAME

(75) Inventors: Sung-Ho Hwang, Seoul (KR);
Duck-Hyung Lee, Seongnam-si (KR);
Chang-Rok Moon, Seoul (KR);
Doo-Won Kwon, Seongnam-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 114 days.

(21) Appl. No.: 11/987,607

(22) Filed: Dec. 3, 2007

(65) Prior Publication Data

US 2008/0131588 A1 Jun. 5, 2008

(30) Foreign Application Priority Data

Dec. 4, 2006 (KR) ...................... 10-2006-0121671

(51) Int. Cl.
*B05D 5/12* (2006.01)

(52) U.S. Cl. .................... 250/208.1; 257/431; 257/432; 359/588

(58) Field of Classification Search .............. 250/208.1; 257/431, 432; 359/588
See application file for complete search history.

(56) References Cited

U.S. PATENT DOCUMENTS

2007/0201137 A1* 8/2007 Alexander et al. .......... 359/588

FOREIGN PATENT DOCUMENTS

| JP | 2003-209235 | | 7/2003 |
| JP | 2005-259828 | A * | 9/2005 |
| JP | 2006-054262 | | 2/2006 |
| KR | 10-2006-0010900 | A | 2/2006 |
| KR | 10-2006-0077100 | A | 7/2006 |
| KR | 10-2006-0077135 | | 7/2006 |

* cited by examiner

*Primary Examiner*—Seung C Sohn
(74) *Attorney, Agent, or Firm*—Harness, Dickey & Pierce, L.L.C.

(57) ABSTRACT

A back-illuminated image sensor may include a substrate in which photodiodes are disposed; an insulating layer on a first surface of the substrate; an interconnection layer in the insulating layer; an anti-reflection layer between the substrate and the insulating layer; a plurality of color filters on a second surface of the substrate opposite to the first surface; and a microlens on the color filters. Because the anti-reflection layer may be between the substrate and an interlayer dielectric layer, the reflection rate of light that passes through the substrate and arrives at an interface between the substrate and the interlayer insulating layer may be reduced.

14 Claims, 5 Drawing Sheets

BACK-ILLUMINATED IMAGE SENSOR AND METHOD OF FABRICATING THE SAME

PRIORITY STATEMENT

The present application hereby claims priority under 35 U.S.C §119 on Korean Patent Application 2006-121671 filed Dec. 4, 2006, the entire contents of which is hereby incorporated herein by reference.

BACKGROUND

An image sensor is a device that converts an optical signal into an electric signal. The image sensor may include a photoelectric conversion unit which senses light and converts the sensed light into an electric signal, and a logic circuit unit which stores the electric signal as data. In order to elevate optical sensitivity, the image sensor may further include a microlens, which may change the path of light to travel to the photoelectric conversion unit to condense light.

In a conventional image sensor, a multilayered interconnection layer may be disposed on a substrate having a photoelectric conversion unit, and a color filter layer and a microlens may be disposed on the interconnection layer. Thus, it may be difficult to ensure a sufficient focal length due to a long distance between the color filter layer and the photoelectric conversion unit, and the scattered reflection and covering of incident light by the interconnection layer may lead to a decline in the light reception efficiency of the photoelectric conversion unit.

In order to improve the foregoing problems, a back-illuminated image sensor has been proposed. In the back-illuminated image sensor, a color filter layer and a microlens may be disposed on a rear surface of a substrate to reduce a distance between a photoelectric conversion unit and the color filter layer and increase the light reception efficiency of light incident on the photoelectric conversion unit.

FIG. 1 is a cross-sectional view of a conventional back-illuminated image sensor. Further, FIG. 1 illustrates a portion of a pixel region of the image sensor excluding a circuit region disposed around the pixel region.

Referring to FIG. 1, a plurality of photodiodes 23 may be disposed in a substrate 20, and an interlayer dielectric layer 24 may be disposed on a first surface of the substrate 20. A multilayered interconnection layer 25, which includes a plurality of interconnection lines, may be disposed in the interlayer dielectric layer 24.

A plurality of color filters 27 may be provided on a second surface of the substrate 20, which may oppose the first surface, and a microlens 29 may be disposed on the color filters 27.

While light condensed by the microlens 29 is passing through the color filters 27, red (R), green (G), or blue (B) light may be selected and incident on the substrate 20. Due to a difference in extinction coefficient according to wavelength, B light having a wavelength near 450 nm and G light having a wavelength near 550 nm may be absorbed in the photodiode 23, while R light having a wavelength near 650 nm may reach an interface between the substrate 20 and the interlayer dielectric layer 24. Thus, when light reflected by the interface between the substrate 20 and the interlayer dielectric layer 24 is incident on an adjacent photodiode 23, undesired ghost images may result.

SUMMARY

Example embodiments may provide a back-illuminated image sensor, which may reduce the reflection of light at an interface between a substrate and an interlayer dielectric layer.

Also, example embodiments may provide a back-illuminated image sensor which reduces or prevents light incident on one photodiode from another photodiode by reflection.

Example embodiments may be directed to a back-illuminated image sensor that may include the following: a substrate in which photodiodes are disposed; an insulating layer on a first surface of the substrate; an interconnection layer in the insulating layer; an anti-reflection layer between the substrate and the insulating layer; a plurality of color filters on a second surface of the substrate opposite to the first surface; and a microlens on the plurality of color filters.

Example embodiments may be directed to a method of fabricating an image sensor including disposing photodiodes in a substrate, forming an anti-reflection layer on a first surface of the substrate, forming an insulating layer on the anti-reflection layer, and forming at least one interconnection layer in the insulating layer.

According to example embodiments, the anti-reflection layer may be formed by alternating a first material layer and a second material layer a plurality of times, and the first and second material layers may have different refractive indexes.

According to example embodiments, the first material layer may have a lower refractive index than the second material layer. According to example embodiments, because the thickness of each of the first and second material layers may be inversely proportional to the refractive index thereof, the first material layer may be thicker than the second material layer.

According to example embodiments, the anti-reflection layer may transmit or absorb light reaching an interface between the substrate and the insulating layer so that light incident on a photodiode from another photodiode by reflection may be inhibited.

DETAILED DESCRIPTION OF EXAMPLE EMBODIMENTS

Figure 1:
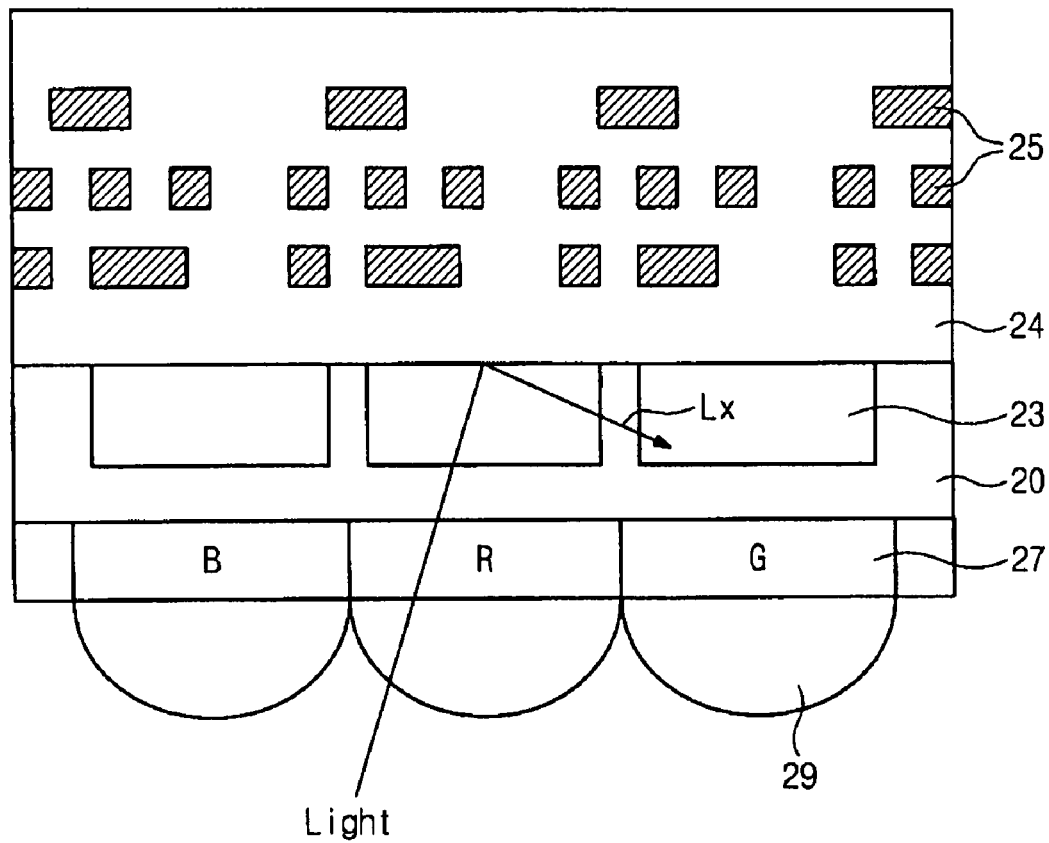
FIG. 1 is a cross-sectional view of a conventional back-illuminated image sensor.

Example embodiments will be described more fully hereinafter with reference to the accompanying drawings. Example embodiments, however, may be embodied in many different forms and should not be construed as limited to examples set forth herein. Rather, these examples are provided so that this disclosure will be thorough and complete, and will fully convey the scope of example embodiments to those skilled in the art. In the drawings, the thicknesses of layers and regions are exaggerated for clarity. It will also be understood that when a layer is referred to as being "on" another layer or substrate, it may be directly on the other layer or substrate, or intervening layers may also be present. Like numbers refer to like elements throughout.

FIG. 2 is a cross-sectional view of a back-illuminated image sensor according to example embodiments.

Figure 2:
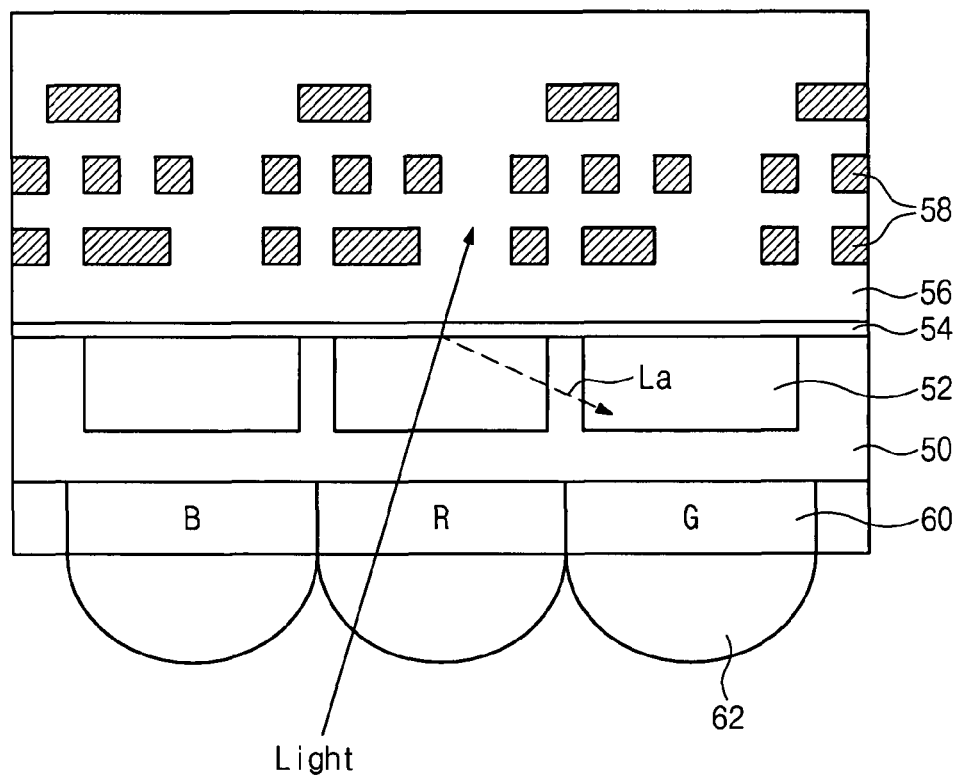
FIG. 2 is a cross-sectional view of a back-illuminated image sensor according to example embodiments.

Referring to FIG. 2, the back-illuminated image sensor may include a multilayered interconnection layer 58, which may be disposed on a first surface of a substrate 50', and a color filter layer and a microlens 62, which may be disposed on a second surface of the substrate 50', which may oppose the first surface.

A pixel region and a peripheral region may be defined in the substrate 50', and a plurality of photodiodes 52 may be disposed in the pixel region to constitute a photoelectric conversion region. An anti-reflection layer 54 may be disposed on the first surface of the substrate 50', and an interlayer dielectric layer 56 may be disposed on the anti-reflection layer 54. The interlayer dielectric layer 56 may include a multilayered insulating layer, and the multilayered interconnection layer 58 may be disposed in the interlayer dielectric layer 56. The substrate 50' may be a semiconductor substrate or a semiconductor epitaxial substrate.

The color filter layer, which includes a plurality of color filters 60, may be disposed on the second surface of the substrate 50', and the microlens 62 may be disposed on the color filters 60. The color filter layer may be provided directly on the substrate 50' or provided over the substrate 50' by interposing an insulating layer therebetween. Similarly, the microlens 62 may be disposed directly on the color filters 60 or disposed over the color filters 60 by interposing a planarization layer therebetween.

Light having a long wavelength may be condensed by the microlens 62 and reach an interface between the substrate 50' and the anti-reflection layer 54. In this case, most of the light may be absorbed in the anti-reflection layer 54 at the interface between the substrate 50' and the anti-reflection layer 54 or transmitted through the anti-reflection layer 54 and partially reflected. Therefore, the amount of light incident to other adjacent photodiodes 52 may be greatly reduced to inhibit the formation of ghost images.

The anti-reflection layer 54 may include a plurality of material layers having different refractive indexes. In example embodiments, the anti-reflection layer 54 may be formed by alternating a first material layer and a second material layer a plurality of times in order to minimize a reflection rate. In this case, the first and second material layers may have different refractive indexes.

Figure 3:
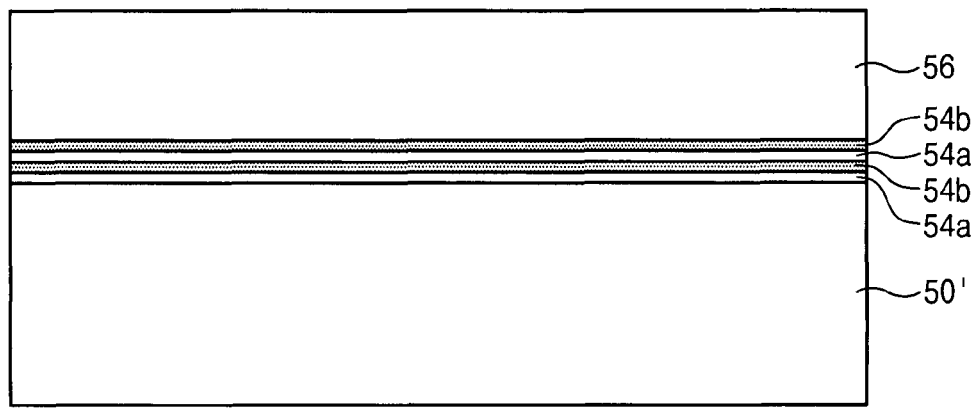
FIG. 3 is a cross-sectional view of an anti-reflection layer of a back-illuminated image sensor according to example embodiments.

FIG. 3 is a cross-sectional view of an anti-reflection layer of a back-illuminated image sensor according to example embodiments.

Referring to FIG. 3, an anti-reflection layer 54 may include a plurality of first material layers 54a and a plurality of second material layers 54b, which may be stacked on a substrate 50'. Although FIG. 3 illustrates two first material layers 54a and two second material layers 54b stacked alternately, the number of the first material layers 54a and the number of the second material layers 54b may vary respectively.

By alternately stacking material layers having different refractive indexes, the refractive index of the anti-reflection layer 54 may have a spatial cycle. The spatial cycle of the refractive index of the anti-reflection layer 54 may affect the properties and path of light passing through the anti-reflection layer 54, so that the anti-reflection layer 54 may selectively transmit, reflect, or absorb light having a specific wavelength. For example, light reflection from an interface between material layers 54a and 54b to substrate 50' may be prevented by confining light incident on the anti-reflection layer 54 in an optical bandgap caused by the spatial cycle of the refractive index of the anti-reflection layer 54. Furthermore, the reflection rate of the light incident on the anti-reflection layer 54 may be lowered due to a destructive interference between light beams reflected from the first and second material layers 54a and 54b.

According to example embodiments, the first material layer 54a may be formed of a material having a lower refractive index than that of the second material layer 54b. The first material layer 54a may also be thicker than the second material layer 54b. Alternatively, each of the first and second material layers 54a and 54b constituting the anti-reflection layer 54 may have a fixed thickness.

For instance, each material layer may have a thickness $$t_f = \frac{\lambda_f}{4}.$$

Here, reference character $t_f$ may denote the thickness of the material layer, and $\lambda_f$ may denote the wavelength of light incident on the material layer. The wavelength $\lambda_f$ of light incident on the material layer may be changed and calculated using the refractive indexes of materials that transmit light in a traveling path. For example, while light having a wavelength $\lambda_0$ in the air is passing through a microlens, a substrate, and an anti-reflection layer, the wavelength $\lambda_0$ of the light may change to a wavelength $\lambda_f$ in a material layer of the anti-reflection layer, and the wavelength $\lambda_f$ may be calculated using the known refractive index of the material layer through which the light has passed.

In other words, the first material layer 54a may have a thickness $$t_a = \frac{\lambda_a}{4},$$

and the second material layer 54b may have a thickness $$t_b = \frac{\lambda_b}{4}.$$

Here, reference character $\lambda_a$ may denote the wavelength of light incident on the first material layer 54a, and $\lambda_b$ may denote the wavelength of light incident on the second material layer 54b.

As a difference in refractive index between the first and second material layers 54a and 54b increases, the efficiency of the anti-reflection layer 54 may increase. Also, the extinction coefficient of each of the first and second material layers 54a and 54b may be large as possible.

Figure 4:
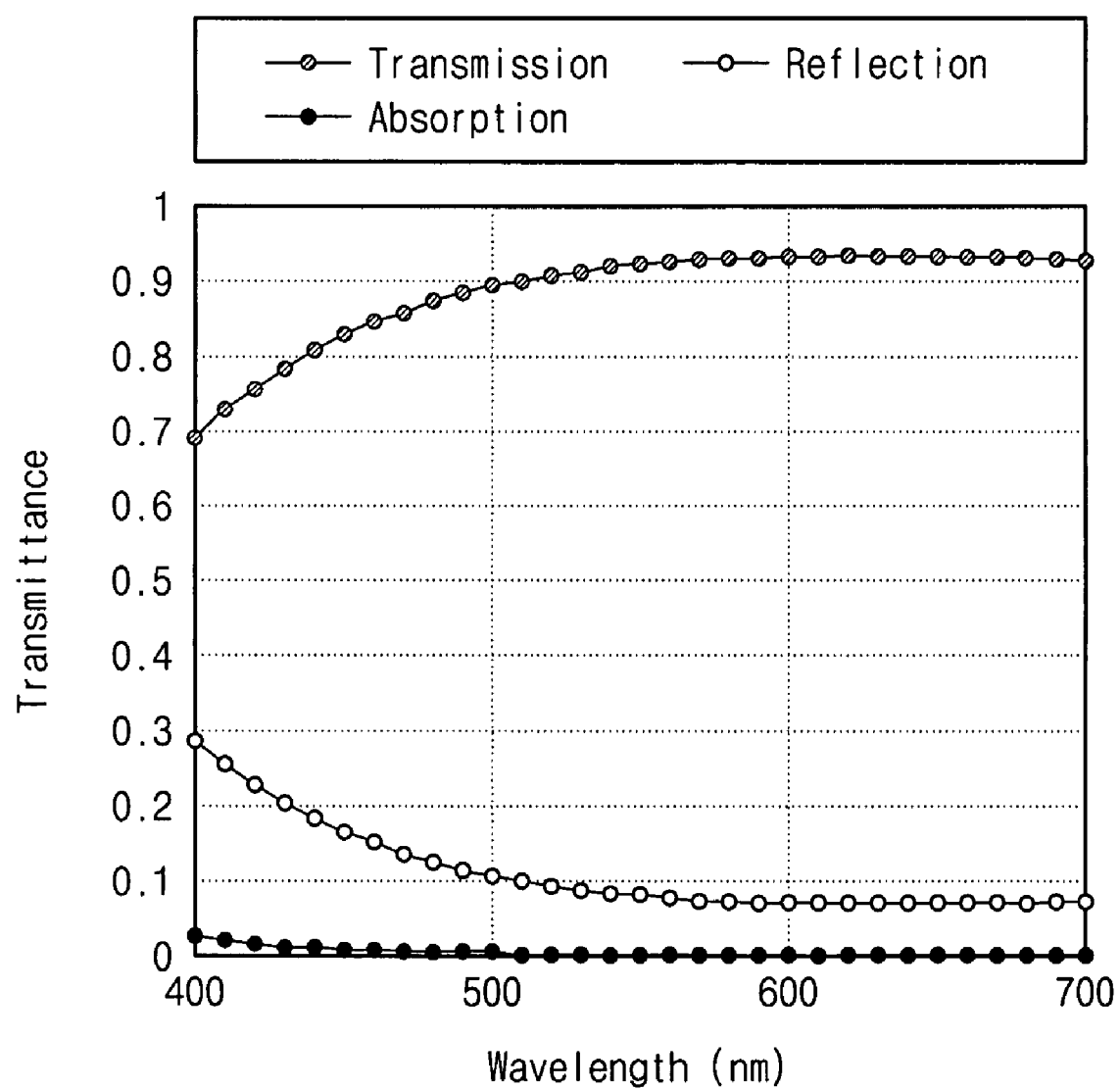
FIG. 4 is a graph showing the transmittance of an anti-reflection layer according to example embodiments.

FIG. 4 is a graph showing the behavior of light at an anti-reflection layer obtained by stacking a 270-Å silicon nitride layer and a 200-Å silicon oxide layer. In FIG. 4, an abscissa may denote the wavelength of light, and an ordinate may denote the transmittance of light.

Referring to FIG. 4, unlike in the conventional case where about 20% of light may be reflected from an interface between a silicon substrate and a silicon oxide layer, 90% or more of red(R) light having a wavelength ranging from 600 to 700 nm may be transmitted through the anti-reflection layer, while only 10% or less of the light may be reflected.

According to example embodiments, the reflection rate of light may be reduced. Also, as the number of the stacked first and second material layers (refer to 54a and 54b in FIG. 3) increases, a destructive interference between reflected light beams may increase, thus further reducing the reflection rate of light.

Figure 5:
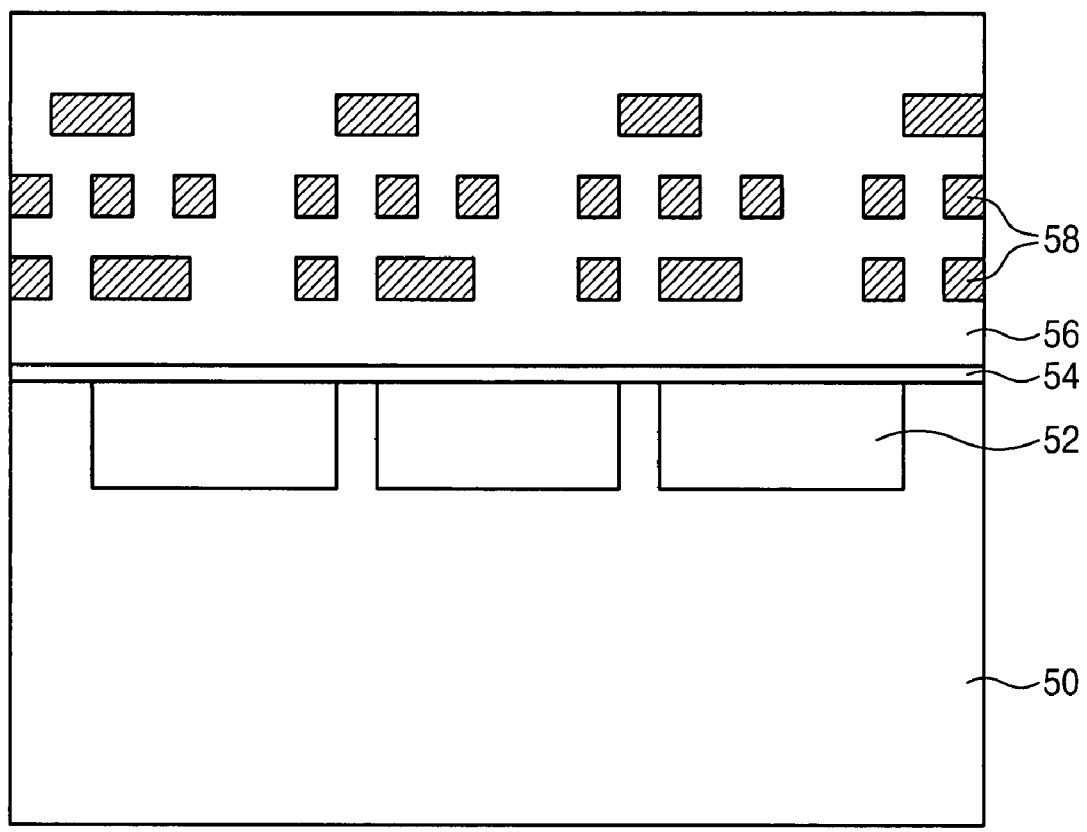
FIGS. 5 through 7 are cross-sectional views illustrating a method of fabricating a back-illuminated image sensor according to example embodiments.
Figure 6:
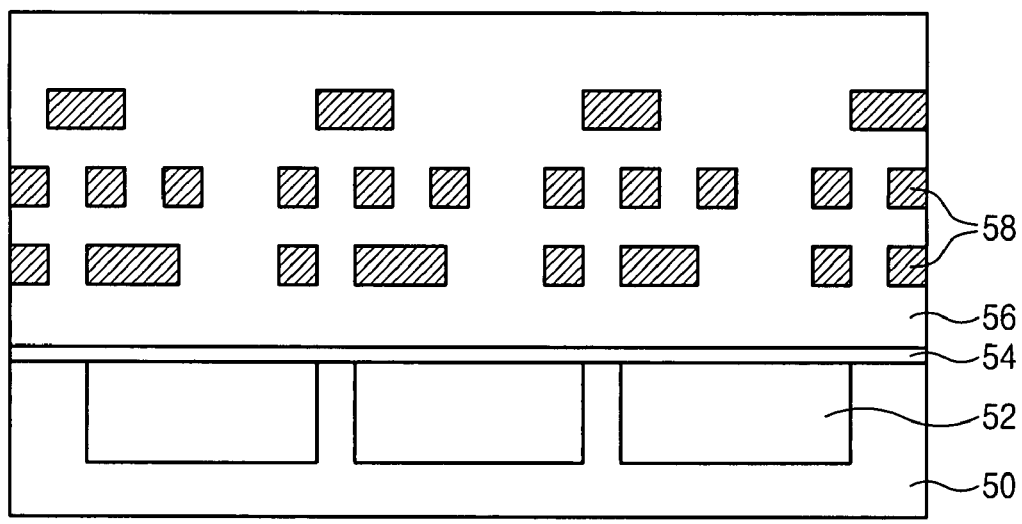
Figure 7:
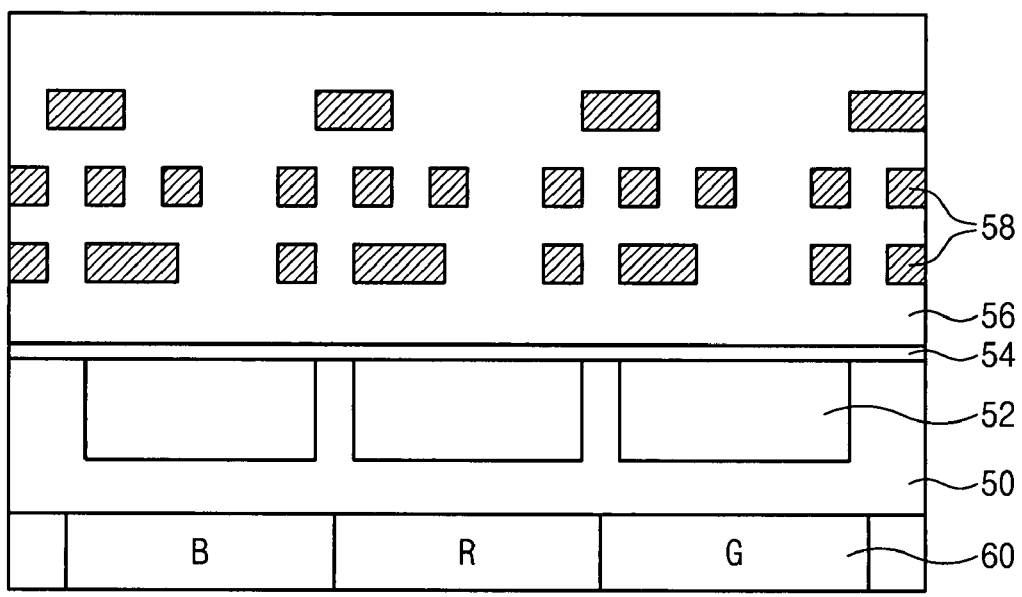

FIGS. 5 through 7 are cross-sectional views illustrating a method of fabricating a back-illuminated image sensor according to example embodiments.

Referring to FIG. 5, a plurality of photodiodes 52 may be disposed in a substrate 50. The structure and forming method of the photodiode 52 and the structure of impurity diffusion regions formed in the substrate 50 may be the same as in a conventional image sensor.

An anti-reflection layer 54 may be formed on a first surface of the substrate 50. As illustrated in FIG. 3, the anti-reflection layer 54 may be formed by alternating two material layers having different refractive indexes. That is, a first material layer and a second material layer may be alternately formed a plurality of times so that the spatial cycle of the refractive index of the anti-reflection layer 54 may be obtained.

Although not shown in the drawings, before forming the anti-reflection layer 54, a plurality of transistors may be formed in the first surface of the substrate 50. The anti-reflection layer 54 may be formed on a pixel region of the substrate 50 where photoelectric conversion units (i.e., the photodiodes 52) may be formed. Thus, after forming the transistors, the anti-reflection layer 54 may be uniformly formed on the entire surface of the substrate 50.

Thereafter, an interlayer dielectric layer 56 and a multilayered interconnection layer 58 may be formed on the substrate 50 having the anti-reflection layer 54. The interlayer dielectric layer 56 may be a multilayered insulating layer. Thus, the interconnection layer 58 and the interlayer dielectric layer 56 may be alternately formed so that the multilayered interconnection layer 58 may be formed in the interlayer dielectric layer 56. Although not shown in the drawings, a local interconnection line may be formed through the interlayer dielectric layer 56 between the interconnection layers 58.

Referring to FIG. 6, after forming the uppermost interconnection layer and a passivation layer, the rear surface of the substrate 50 may be polished until the substrate 50' is left to a predetermined thickness. In this case, the substrate 50' may be polished to the minimum possible thickness considering the structure of a well of the image sensor and the structure of the photodiode 52 of the pixel region, thus reducing a distance between color filters and the photodiodes 52.

Referring to FIG. 7, color filters 60 may be formed on a second surface of the substrate 50', which may oppose the first surface. The color filters 60 may be formed directly on the substrate 50' or formed over the substrate 50' by interposing an insulating layer therebetween.

Although not shown in FIG. 7, a microlens (refer to 62 in FIG. 2) may be formed on the color filters 60. The microlens 62 may be formed over the color filters 60 by interposing a planarization layer therebetween.

According to example embodiments as described above, an anti-reflection layer may be formed between a substrate and an interlayer dielectric layer, thus markedly reducing the reflection rate of light that passes through the substrate and arrives at an interface between the substrate and the interlayer dielectric layer.

The anti-reflection layer may be formed using such a material and structure as to increase the efficiency of anti-reflection against light having a long wavelength so that light incident to an adjacent photodiode, which may be reflected from the interface between the substrate and the interlayer dielectric layer, may be reduced or removed.

Furthermore, a back-illuminated image sensor according to example embodiments may inhibit light incident on a photodiode from traveling to other adjacent photodiodes so that the formation of ghost images may be prevented and clear images may be obtained.

The above-disclosed subject matter is to be considered illustrative, and not restrictive, and the appended claims are intended to cover all such modifications, enhancements, and other example embodiments, which fall within the true spirit and scope of the present example embodiments. Thus, to the maximum extent allowed by law, the scope of the example embodiments is to be determined by the broadest permissible interpretation of the following claims and their equivalents, and shall not be restricted or limited by the foregoing detailed description.

What is claimed is:

1. An image sensor comprising:
a substrate in which photodiodes are disposed;
an insulating layer on a first surface of the substrate;
an interconnection layer in the insulating layer; and
an anti-reflection layer between the substrate and the insulating layer, wherein
the anti-reflection layer is formed by alternating a first material layer and a second material layer a plurality of times, the first and second material layers having different refractive indexes,
the first material layer has a lower refractive index than that of the second material layer, and
the first material layers constituting the anti-reflection layer have a same thickness, and the second material layers constituting the anti-reflection layer have a same thickness.

2. The image sensor of claim 1, further comprising:
a plurality of color filters on a second surface of the substrate opposed to the first surface; and
a microlens on the plurality of color filters.

3. The image sensor of claim 2, wherein the anti-reflection layer inhibits the reflection of light at an interface between the substrate and the insulating layer, and the light incident through the microlens is transmitted through the substrate.

4. The image sensor of claim 1, wherein the first material layer includes silicon oxide and the second material layer includes silicon nitride.

5. The image sensor of claim 1, wherein the first material layer includes silicon oxide and the second material layer includes silicon oxynitride.

6. The image sensor of claim 1, wherein the first material layer has a thickness $$t_a = \frac{\lambda_a}{4},$$

and the second material layer has a thickness $$t_b = \frac{\lambda_b}{4},$$

with a denoting the first material layer, b denoting the second material layer, t denoting thickness, and $\lambda$ denoting the wavelength of light incident to a material layer.

7. A method of fabricating an image sensor comprising:
disposing phototodiodes in a substrate;
forming an anti-reflection layer on a first surface of the substrate;
forming an insulating layer on the anti-reflection layer; and
forming at least one interconnection layer in the insulating layer, wherein
the forming the anti-reflection layer includes forming a first material layer and a second material layer a plurality of times, the first and second material layers having different refractive indexes,
the first material layer has a lower refractive index than that of the second material layer, and
the first material layers constituting the anti-reflection layer have a same thickness, and the second material layers constituting the anti-reflection layer have a same thickness.

8. The image sensor of claim 7, further comprising:
forming a plurality of color filters on a second surface of the substrate opposing the first surface; and
disposing a microlens on the plurality of color filters.

9. The method of claim 8, further comprising:
reducing a thickness of the substrate to reduce a distance between the plurality of color filters and the photodiodes.

10. The method of claim 8, wherein the anti-reflection layer inhibits the reflection of light at an interface between the substrate and the insulating layer by transmitting the light incident on the microlens through the substrate.

11. The method of claim 7, wherein the insulating layer is formed from at least one interlayer dielectric layer, alternating the at least one interconnection layer and the at least one interlayer dielectric layer, and forming a local interconnection line through the interlayer dielectric layer between the at least one interconnection layer.

12. The method of claim 7, wherein the first material layer has a thickness $$t_a = \frac{\lambda_a}{4},$$

and the second material layer has a thickness $$t_b = \frac{\lambda_b}{4},$$

with a denoting the first material layer, b denoting the second material layer, t denoting thickness, and λ denoting the wavelength of light incident to a material layer.

13. An image sensor, comprising:
a substrate in which photodiodes are disposed;
an insulating layer on a first surface of the substrate;
an interconnection layer in the insulating layer;
an anti-reflection layer between the substrate and the insulating layer;
a plurality of color filters on a second surface of the substrate opposed to the first surface; and
a microlens on the plurality of color filters.

14. A method of fabricating an image sensor comprising:
disposing phototodiodes in a substrate;
forming an anti-reflection layer on a first surface of the substrate;
forming an insulating layer on the anti-reflection layer;
forming at least one interconnection layer in the insulating layer;
forming a plurality of color filters on a second surface of the substrate opposing the first surface; and
disposing a microlens on the plurality of color filters.

* * * * *